(12) United States Patent
Ruby et al.

(10) Patent No.: US 8,232,845 B2
(45) Date of Patent: Jul. 31, 2012

(54) PACKAGED DEVICE WITH ACOUSTIC RESONATOR AND ELECTRONIC CIRCUITRY AND METHOD OF MAKING THE SAME

(75) Inventors: Richard C. Ruby, Menlo Park, CA (US); Martha K. Small, Fort Collins, CO (US)

(73) Assignee: Avago Technologies Wireless IP (Singapore) Pte. Ltd., Singapore (SG)

( * ) Notice: Subject to any disclaimer, the term of this patent is extended or adjusted under 35 U.S.C. 154(b) by 61 days.

(21) Appl. No.: 12/891,039

(22) Filed: Sep. 27, 2010

(65) Prior Publication Data

US 2012/0075026 A1    Mar. 29, 2012

(51) Int. Cl.
 *H03B 1/00* (2006.01)
(52) U.S. Cl. ............... 331/68; 331/158; 257/416
(58) Field of Classification Search .......... 331/68, 331/158; 257/416
 See application file for complete search history.

(56) References Cited

U.S. PATENT DOCUMENTS

| | | | |
|---|---|---|---|
| 5,668,057 A | 9/1997 | Eda et al. | |
| 6,228,675 B1 | 5/2001 | Ruby et al. | |
| 6,265,246 B1 | 7/2001 | Ruby et al. | |
| 6,376,280 B1 | 4/2002 | Ruby et al. | |
| 6,429,511 B2 | 8/2002 | Ruby et al. | |
| 6,946,928 B2 | 9/2005 | Larson, III et al. | |
| 7,190,238 B2 * | 3/2007 | Hosokawa et al. | 331/158 |
| 7,358,651 B2 | 4/2008 | Ruby et al. | |
| 7,385,467 B2 | 6/2008 | Stoemmer et al. | |
| 7,615,833 B2 | 11/2009 | Larson, III et al. | |
| 7,629,865 B2 | 12/2009 | Ruby | |
| 7,696,004 B2 * | 4/2010 | Yuan et al. | 438/106 |
| 2006/0001123 A1 * | 1/2006 | Heck et al. | 257/528 |
| 2008/0202239 A1 | 8/2008 | Fazzio et al. | |
| 2009/0146746 A1 | 6/2009 | Unkrich et al. | |
| 2010/0112743 A1 | 5/2010 | Kawauchi | |

FOREIGN PATENT DOCUMENTS

WO    WO-2009111874    9/2009

OTHER PUBLICATIONS

R. Aigner, "High performance RF-filters suitable for above IC integration: film bulk-acoustic- resonators (FBAR) on Silicon", Proceedings of the IEEE of Custom Integrated Circuits Conference, 2003, pp. 141-146.

L. Elbrecht et al., "Integration of bulk acoustic wave filters: concepts and trends", IEEE MTT-S International Microwave Symposium Digest, 2004, vol. 1, pp. 395-398.

(Continued)

*Primary Examiner* — Joseph Chang

(57) ABSTRACT

A device includes: a base substrate having a bonding pad and a peripheral pad, the peripheral pad encompassing the bonding pad; an acoustic resonator on the base substrate; a cap substrate having a bonding pad seal and a peripheral pad seal, the bonding pad seal bonding around the perimeter of the bonding pad and the peripheral pad seal bonding with the peripheral pad to define a hermetically sealed volume between the cap substrate and the base substrate, the cap substrate having a through hole therein over the bonding pad providing access for a connection to the bonding pad; a low-resistivity material layer region disposed on a portion of a surface of the cap substrate disposed inside the hermetically sealed volume, the material layer region being isolated from the bonding pad seal; and electronic circuitry disposed in the material layer region and electrical connected with the acoustic resonator.

21 Claims, 9 Drawing Sheets

OTHER PUBLICATIONS

M.-A Dubois et al., "Monolithic above-IC resonator technology for integrated architectures in mobile and wireless communication," IEEE Journal of Solid-State Circuits, vol. 41, Issue: 1, pp. 7-16.

M. Aissi et al., "A 5 GHz above-IC FBAR low phase noise balanced oscillator", Radio Frequency Integrated Circuits (RFIC) Symposium, 2006, 4 pages.

"RF MEMS: Reference", http://www.thefullwiki.org/RF_MEMS Jan. 13, 2011, 1-3.

3D MEMS Software, , "One-Axis Accelerometer with sigma-delta modulator", http://www.coventor.com/mems/applications/One_Axis_Accelerometer Current Form Jun. 17, 2011, 1-3.

* cited by examiner

PACKAGED DEVICE WITH ACOUSTIC RESONATOR AND ELECTRONIC CIRCUITRY AND METHOD OF MAKING THE SAME

BACKGROUND

Small acoustic components, including specifically acoustic transducers and resonators, are being employed in a number of devices, including for example, oscillators. Acoustic transducers and resonators are manufactured using a variety of different technologies, including for example film bulk acoustic wave (FBAR) devices. Acoustic components are typically manufactured on substrates separate from device electronics due to incompatibilities in both processing and substrate requirements. The substrate for an acoustic device such at FBAR must have very high resistivity to avoid substrate coupling to the resonator. Semiconductor devices (e.g., transistors) require much lower resistivity in the device region. In the past, acoustic components have been manufactured, for example, with processes where the acoustic component is placed in a metal, ceramic, or plastic package and a lid is bonded to the package. The package must be hermetic and contain a cavity for the resonator. In a typical configuration, an electrical connection between the acoustic component and the rest of the electronic circuitry for a device (e.g., an oscillator) is provided through a lead or wire from the package to an external circuit board to which the packaged acoustic resonator is attached or connected, and on which the rest of the electronic circuitry of the device is provided.

However, an electrical signal transmitted via the lead or wire between such a packaged acoustic component and external electronic circuitry is subject to loss, noise and/or interference due to the interconnect lead length, all of which can degrade the performance characteristics of the device.

What is needed, therefore, is an improved packaging arrangement and method for devices, particularly devices that include electronic circuitry and acoustic devices.

SUMMARY

In an example embodiment a packaged device comprises: a base substrate having a first bonding pad and a peripheral pad provided thereon, the peripheral pad encompassing the first bonding pad; an acoustic resonator provided on the base substrate; a cap substrate having a bonding pad seal and a peripheral pad seal provided thereon, the bonding pad seal bonding around the perimeter of the first bonding pad and the peripheral pad seal bonding with the peripheral pad to define a hermetically sealed volume between the cap substrate and the base substrate, the cap substrate defining a through hole therein positioned over the first bonding pad, the through hole providing access for an electrical connection to the first bonding pad; a material layer region disposed on a portion of a first surface of the cap substrate within the hermetically sealed volume, wherein the material layer region comprises a material having a substantially lower resistivity than the cap substrate and is electrically isolated from the bonding pad seal; and electronic circuitry formed on the material layer region and electrically connected with the acoustic resonator.

In another example embodiment, a method of making a packaged device comprises: providing a base substrate; providing a cap substrate; and bonding the base substrate to the cap substrate to define a hermetically sealed volume between the cap substrate and the base substrate. The base substrate includes: a first bonding pad, a peripheral pad encompassing the first bonding pad, and an acoustic resonator. The cap substrate includes: a bonding pad seal having a through hole therein; a peripheral pad seal encompassing the bonding pad seal; a material layer region provided on a portion of a first surface of the cap substrate; and electronic circuitry formed on the material layer region. The material layer region comprises a material having a substantially lower resistivity than the cap substrate and is electrically isolated from the bonding pad seal. The electronic circuitry formed on the material layer region is electrically connected with the acoustic resonator.

In yet another example embodiment, a packaged device comprises: a base substrate having a bonding pad and a peripheral pad provided on a first side thereof, the peripheral pad encompassing the bonding pad, wherein the base substrate has a through hole therein positioned beneath the bonding pad, the through hole providing access for making an electrical connection to the bonding pad; an acoustic resonator disposed on the base substrate; a cap substrate having a drop down contact post and a peripheral pad seal provided thereon, the drop down contact post having an electrically conductive layer on a portion thereof and bonding with the bonding pad, and the peripheral pad seal bonding with the peripheral pad to define a hermetically sealed volume between the cap substrate and the base substrate; a material layer disposed on at least a portion of a first surface of the cap substrate disposed in the hermetically sealed volume, and electronic circuitry formed on the material layer and electrically connected with the acoustic resonator, wherein the dropdown contact post includes an electrically insulating material, and wherein the metal layer on the dropdown contact post is electrically isolated from the material layer.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions shown in the drawings may be arbitrarily increased or decreased for clarity of discussion. Wherever applicable and practical, like reference numerals refer to like elements.

DETAILED DESCRIPTION

In the following detailed description, for purposes of explanation and not limitation, example embodiments disclosing specific details are set forth in order to provide a thorough understanding of an embodiment according to the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparati and methods may be omitted so as to not obscure the description of the example embodiments. Such methods and apparati are clearly within the scope of the present teachings.

Unless otherwise noted, when a first device is said to be connected to a second device, this encompasses cases where one or more intermediate devices may be employed to connect the two devices to each other. However, when a first device is said to be directly connected to a second device, this encompasses only cases where the two devices are connected to each other without any intermediate or intervening devices. Similarly, when a signal is said to be coupled to a device, this encompasses cases where one or more intermediate devices may be employed to couple the signal to the device. However, when a signal is said to be directly coupled to a device, this encompasses only cases where the signal is directly coupled to the device without any intermediate or intervening devices. As used herein, "approximately" means within 10%. As used herein, when a first structure, material, or layer is the to cover a second structure, material, or layer, this includes cases where the first structure, material, or layer substantially or completely encases or surrounds the second structure, material or layer.

Specific embodiments of electronic devices, and methods of making such devices, will now be described below in the specific context of devices (e.g., oscillators) employing acoustic resonators, where the disclosed packaging arrangements and methods of manufacture have particular benefits. However it should be understood that the packaging arrangements and methods of manufacture described below have applicability and benefits for a wide variety of electronic devices other than the specific example embodiments described below.

Figure 1:
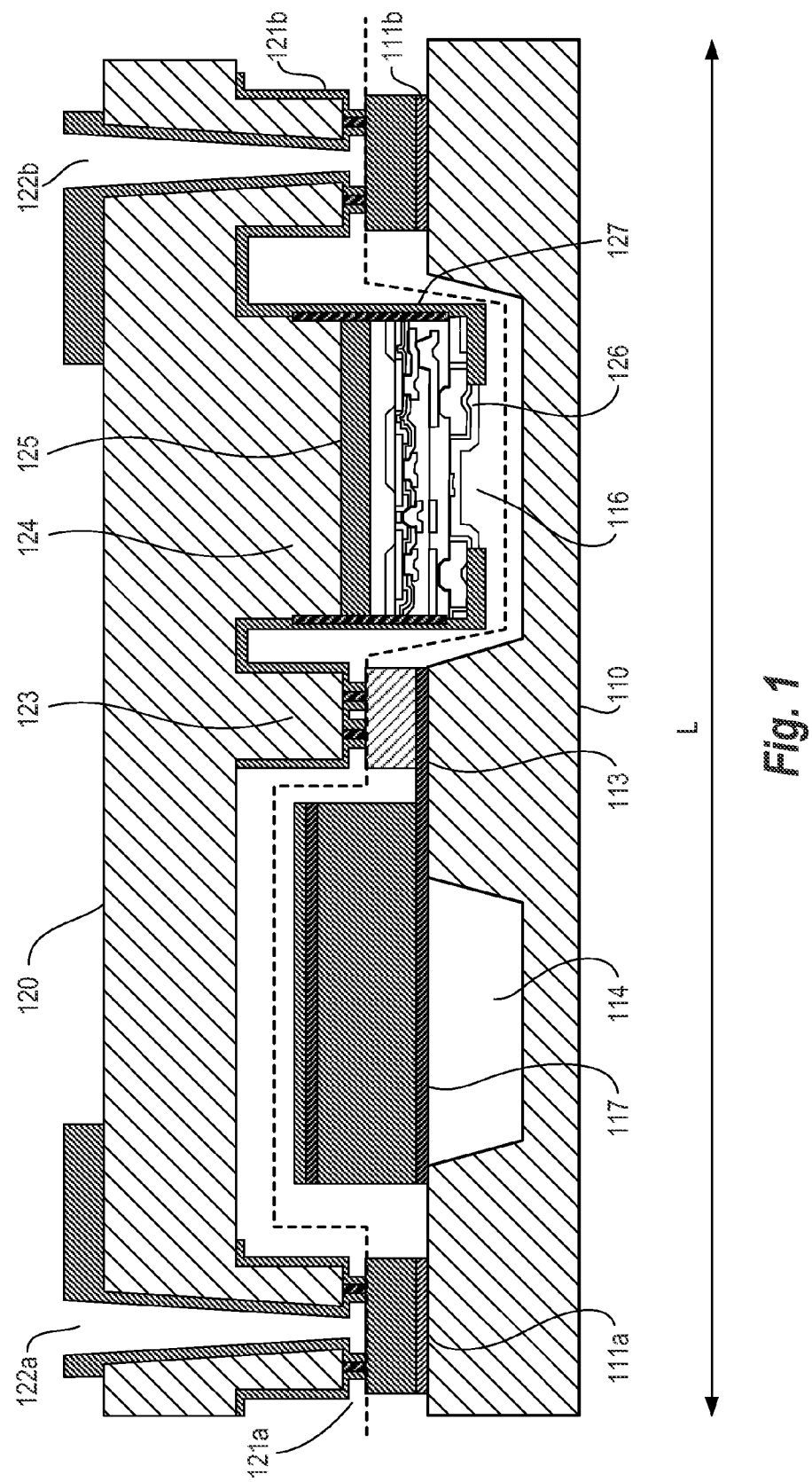
FIG. 1 shows a cross-sectional view of a portion of one example embodiment of a packaged device.

FIG. 1 shows a cross-sectional view of a portion of one example embodiment of a packaged device 100. Packaged device 100 comprises a base substrate 110 and a cap substrate 120.

Figure 2:
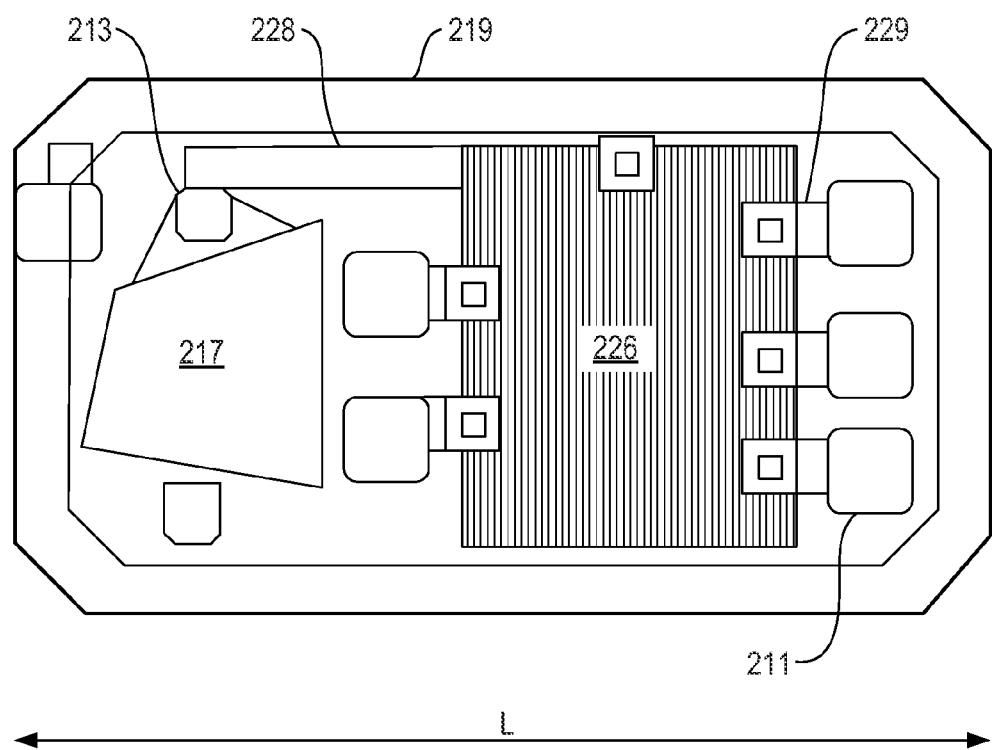
FIG. 2 shows a top cutaway view of another example embodiment of a packaged device.
Figure 3A:
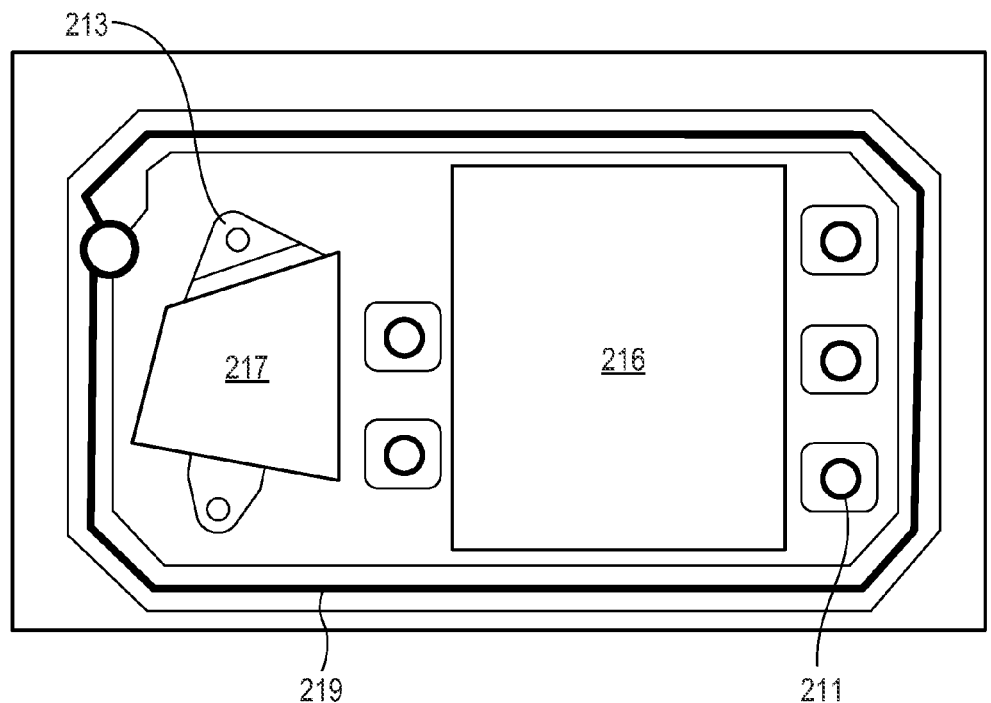
FIGS. 3A-B show two substrates employed in the packaged device of FIG. 2.

Base substrate 110 has on a first surface (top surface as shown in FIG. 1) thereof: first bonding pads 111a and 111b; a second bonding pad 113; a first recessed region 114; and a second recessed region 116. Base substrate 110 further includes on the first surface thereof a peripheral pad not shown in FIG. 1, but examples of which are illustrated in FIGS. 2 and 3A. Beneficially, first bonding pads 111a and 111b, second bonding pad 113, and the peripheral pad are formed of an electrically conductive (e.g., metal) material. Also, in some embodiments base substrate 110 may include additional first and second bonding pads 111 and 113.

Figure 3B:
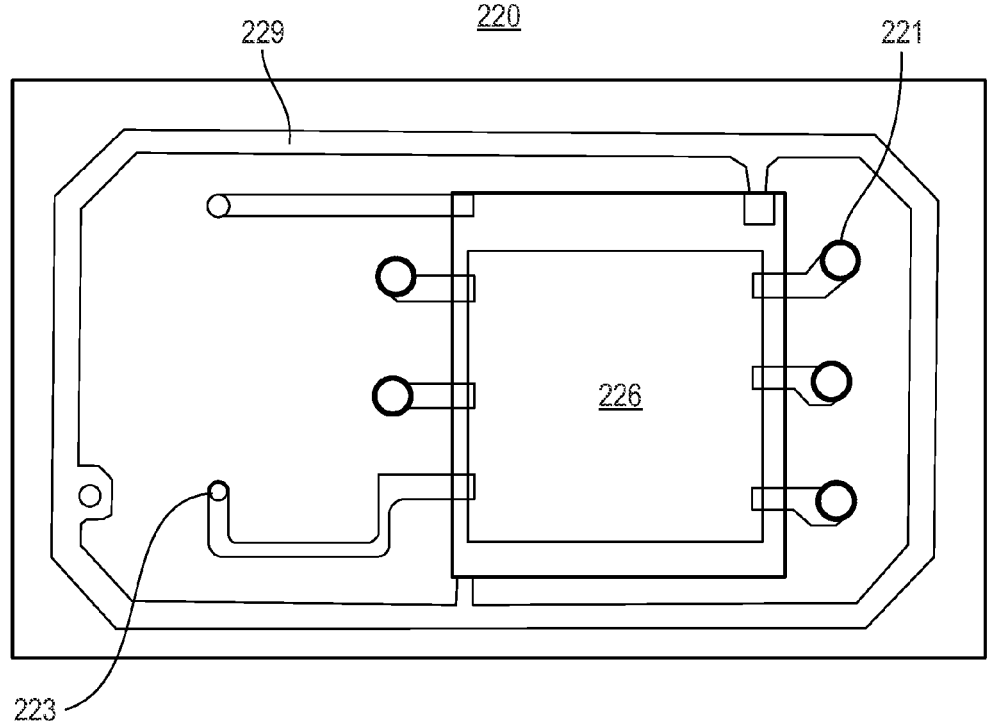

Cap substrate 120 has on a first surface (bottom surface as shown in FIG. 1) thereof: bonding pad seals 121a and 121b, each having a corresponding through hole 122a and 122b formed in cap substrate 120; a drop down contact post 123; a pedestal 124; a low-resistivity material layer region 125; and electronic circuitry 126 formed on low-resistivity material layer region 125. Cap substrate 120 further includes on the first surface thereof a peripheral pad seal not shown in FIG. 1, but examples of which are illustrated in FIGS. 2 and 3B. Beneficially, bonding pad seals 121a and 121b and drop down contact post 123 each have an electrically conductive (e.g., a metal such as gold) layer thereon for making contact with the corresponding bonding pads 111 and 113. Also, in some embodiments cap substrate 120 may include additional bonding pad seals 121 and/or additional drop down contact posts 123. In some embodiments, one or more of through holes 122 in cap substrate 120 are plated or otherwise filled with a conductive material (e.g., metal) to provide an electrical connection between the metal layer of a corresponding bonding pad seal 121 and a second surface (top surface as shown in FIG. 1) of cap substrate 120, for example a pad on the second surface of cap substrate 120. As shown in FIG. 1, in some embodiments, bonding pad seals 121 and/or drop down contact posts 123 include treads or gaskets that are covered with the electrically conductive material.

Packaged device 100 further comprises an acoustic resonator 117 disposed on base substrate 110 above first recessed region 114. In some embodiments, acoustic resonator 117 is electrically connected to electronic circuitry 126, for example by means of second bonding pad 113 and the conductive (e.g., metal) layer on drop down contact post 123. In some embodiments, acoustic resonator 117 comprises a film bulk acoustic resonator (FBAR). In other embodiments, a solidly mounted resonator (SMR) may be employed. In some embodiments, electronic circuitry 126 includes one or more transistors or other active devices of an electrical device that operates with acoustic resonator 117.

In some embodiments, base substrate 110 and/or cap substrate 120 comprise a semiconductor substrate. In some embodiments, cap substrate 120 can be made of an electronically non-conductive material or a high-resistivity semiconductor material, such as single crystal silicon. Also, in some embodiments when cap substrate 120 is a semiconductor substrate, low-resistivity material layer region 125 comprises an epitaxial layer formed on the semiconductor substrate. In alternative embodiments, cap substrate 120 may comprise other high-resistivity materials, for example a silicon-on-insulator (SOI) substrate, and low-resistivity material layer region 125 may be formed by controlled doping of the SOI substrate.

In some embodiments, base substrate 110 and cap substrate 120 are made of materials that have the same or approximately the same coefficient of thermal expansion (CTE) as each other to avoid thermal expansion mismatch problems. In some embodiments base substrate 110 and cap substrate 120 are made of the same semiconductor material as each other.

As noted above, in some embodiments cap substrate 120 is a semiconductor substrate. In general, such a semiconductor substrate on which electronic circuitry 126 is to be fabricated will have a low-resistivity material layer disposed on all or substantially all of a surface thereof for the formation of the semiconductor or active devices of electronic circuitry 126. In particular, such a low-resistivity material layer comprises a material that has a substantially lower resistivity than the high-resistivity semiconductor material of cap substrate 120. As used herein, "substantially lower resistivity" means about one order of magnitude lower resistivity, or more than one order of magnitude lower resistivity, for example as measured in terms of $\Omega$-cm. For example, in some embodiments, the high-resistivity semiconductor material of cap substrate 120 has a resistivity of more than 1000 $\Omega$-cm, while the low-resistivity material of a low-resistivity material layer has a resistivity of less than 100 $\Omega$-cm, including in some embodiments a resistivity in a range of 10 $\Omega$-cm. Accordingly, if left intact on cap substrate 120, such a low-resistivity material layer may provide a low impedance path or electrical short between the conductive (e.g., metal) layer(s) of bonding pad seals 121 and/or drop down contact post(s) 123. This can degrade the performance of packaged device 100, and in some cases may render packaged device 100 inoperable.

Accordingly, in some embodiments one or more portions of the low-resistivity material layer is removed between bonding pad seals 121, drop down contact posts 123, and the peripheral pad seal so as to eliminate a current path through the low-resistivity material layer between any of the bonding pad seals 121, drop down contact posts 123, and the peripheral pad seal. Furthermore, in some embodiments one or more portions of the low-resistivity material layer are removed so as to eliminate a current path between low-resistivity material layer region 125 and the conductive layer(s) of some or all of the bonding pad seals 121, and/or drop down contact posts 123, and/or the peripheral pad seal.

In a particular embodiment of packaged device 100 shown in FIG. 1, the low-resistivity material layer (e.g., epitaxial layer) is eliminated except for: (1) low-resistivity material layer (e.g., epitaxial layer) region 125, which is isolated from some or all of the bonding pad seals 121, and/or drop down contact posts 123, and/or the peripheral pad seal; and (2) one or more low-resistivity material layer (e.g., epitaxial layer) portions remaining in the treads of one or more of the bonding pad seal(s) 121, drop down contact post(s) 123, and the peripheral pad seal. Furthermore, cap substrate 120 of packaged device 100 includes an electrically insulating material 127 (e.g., an oxide such as silicon oxide) electrically isolating low-resistivity material layer (e.g., epitaxial layer) region 125 from one or more electrically conductive (e.g., metal) layers or traces in contact with bonding pad seal(s) 121 and drop down contact post(s) 123. In some embodiments, electrically insulating material 127 partially or totally encompasses or surrounds low-resistivity material layer (e.g., epitaxial layer) region 125.

In some embodiments, cap substrate 120 may have a low-resistivity material layer (e.g., epitaxial layer) formed entirely on the first surface thereof, and the low-resistivity material layer (e.g., epitaxial layer)—except for low-resistivity material layer (e.g., epitaxial layer) region 125 and the low-resistivity material layer (e.g., epitaxial layer) portions remaining in the treads—may be removed after formation of electronic circuitry 126. In other embodiments, the low-resistivity material layer (e.g., epitaxial layer)—except for low-resistivity material layer (e.g., epitaxial layer) region 125 and the low-resistivity material layer (e.g., epitaxial layer) portions remaining in the treads—may be removed before formation of electronic circuitry 126.

In other embodiments, the low-resistivity material layer (e.g., epitaxial layer) is only removed in areas surrounding each of the bonding pad seals 121, and/or drop down contact posts 123, and/or the peripheral pad seal so as to electrically isolate the bonding pad seals 121, and/or drop down contact posts 123, and/or the peripheral pad seal from each other and/or from electronic circuitry 126.

FIG. 2 shows a top cutaway view of another example embodiment of a packaged device 200. Packaged device 200 comprises a base substrate 210 and a cap substrate 220, which are better seen in FIGS. 3A and 3B. FIG. 2 illustrates an electrically conductive trace or connection 228 between electronic circuitry 226 and an acoustic resonator 217 of packaged device 200 via second bonding pad 213 and drop down contact post 223 (see FIG. 3B), and an electrically conductive trace or connection 228 between electronic circuitry 226 of packaged device 200 and first bonding pad 211 via bonding pad seal 221. FIG. 2 also shows that acoustic resonator 217 is laterally offset with respect to electronic circuitry 226 in packaged device 200.

In particular, FIG. 3A shows base substrate 210, and FIG. 3B shows cap substrate 220. FIG. 3A illustrates first bonding pad 211, second bonding pad 213, peripheral pad 219, a second recessed region 216 that is disposed beneath electronic circuitry 226 when base substrate 210 is bonded to cap substrate 220 to form packaged device 200. FIG. 3B shows peripheral pad seal 229, bonding pad seal 221, and drop down contact post 223.

Packaged device 200 may include features described above with respect to packaged device 100, including electrical isolation of an epitaxial layer region on cap substrate 220 from bonding pad seal 221, drop down contact post 223 and peripheral pad seal 229.

In some embodiments, base substrates 110/210, and cap substrates 120/220, are configured to parametrically tested individually prior to assembly.

An example process of assembling packaged devices 100 and 200 will now be described.

In the example embodiment, bonding pad treads or gaskets of bonding pad seal(s) match the perimeters of the first bonding pad(s) on the base substrate, drop down contact post treads or gaskets of drop down contact post(s) match the perimeters of the second bonding pad(s) on the base substrate, and peripheral pad treads or gaskets of the peripheral pad seal match the peripheral pad on the base substrate. Wells are located inside the perimeters of the bond pad gaskets and are formed to a predetermined depth in the cap substrate. The cap substrate is then placed over the base substrate so as to bond (e.g., a cold weld bond) the peripheral pad seal to the peripheral pad, and to likewise bond the bonding pad seal(s) and the drop down contact post(s) to corresponding bonding pad(s) and form a hermetically sealed volume between the bonding pad seals and the peripheral pad seal. The cap substrate is thinned to form a "microcap." Essentially, the microcap is thinned below a predetermined depth until the wells become through holes that provide access for making an electrical connection to the bonding pads inside the package, but outside the hermetically sealed volume, for external conductors, which may include conductive wires provided inside the though holes and/or a conductive (e.g., metal) layer plated or deposited in the through holes. This arrangement assures a highly reliable hermetic seal for devices (e.g., electronic circuitry and acoustic resonator) inside the package, while allowing electrical connections without passing through a seal. Further, this process permits the substrates to be made thin because it forms the microcap in situ and avoids the handling of the fragile microcap during assembly.

A description of additional details regarding embodiments of methods of assembling a cap substrate to a base substrate are described in U.S. Pat. No. 6,425,911, which description is hereby incorporated herein by reference as if set forth herein.

When the base substrate and cap substrate are bonded together as described above a hermetically-sealed volume is formed between the cap substrate and the base substrate. In that case, the acoustic resonator, the low-resistivity material layer (e.g., epitaxial layer) region, the electronic circuitry, the second bonding pad(s), and the drop down contact post(s) are disposed within the hermetically-sealed volume.

In some embodiments, base substrates 110/210, and cap substrates 120/220, are individually parametrically tested prior to bonding the semiconductor substrates together.

The packaging arrangement illustrated above with respect to packaged devices 100 and 200 may be employed for a variety of electronic devices.

In some embodiments, packaged devices 100 and/or 200 may comprise an oscillator. In that case, electronic circuitry 126/226 may include one or more transistors or other active devices of the oscillator. Beneficially, the packaging arrangement of packaged devices 100 and 200 may provide certain benefits for such an oscillator, including a small size, and tight coupling between the resonator and the active circuitry of the oscillator which can reduce noise and losses and therefore improve performance of the oscillator.

Figure 4A:
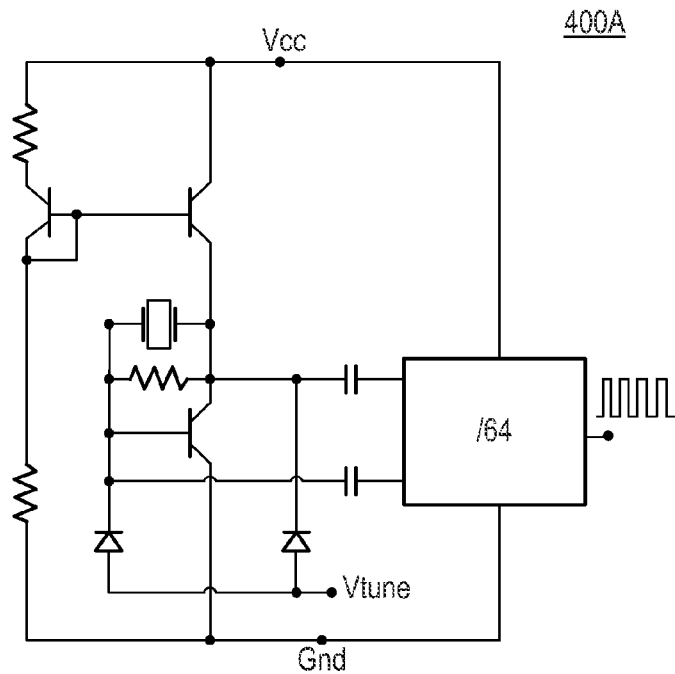
FIGS. 4A-B show schematic circuit diagrams of two example embodiments of an oscillator.
Figure 4B:
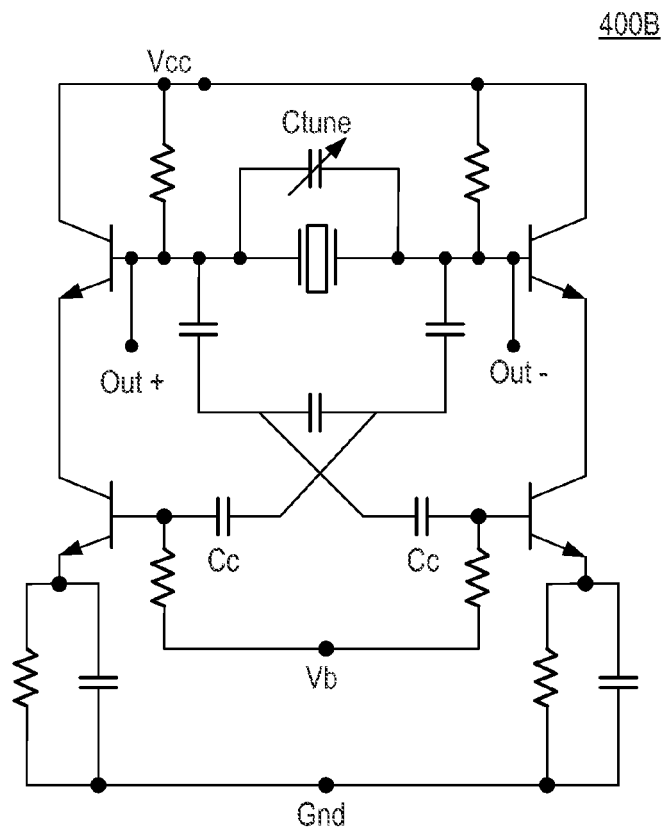

FIGS. 4A-B show schematic circuit diagrams of two example embodiments of oscillators. In particular, FIG. 4A shows one example embodiment of a device 400A comprising a Pierce oscillator with a divider, and FIG. 4B shows one example embodiment of a device 400B comprising a Colpitts oscillator. In some embodiments, packaged devices 100 and/or 200 may comprise an oscillator such as device 400A or device 400B. In other embodiments, packaged devices 100 and/or 200 may comprise other oscillator configurations.

Figure 5:
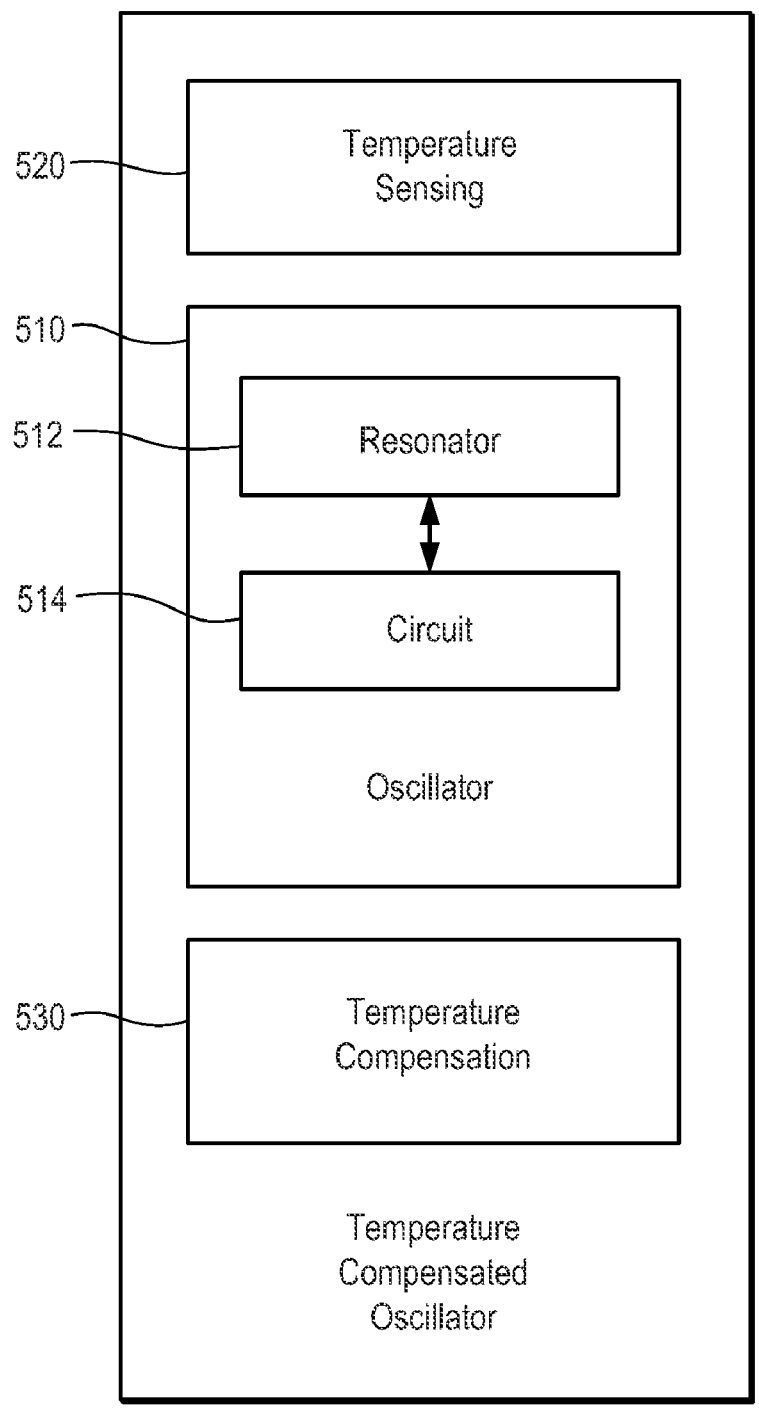
FIG. 5 shows a functional block diagram of one example embodiment of a temperature compensated oscillator.

FIG. 5 shows a functional block diagram of one example embodiment of a temperature compensated oscillator (TCO) 500. In some embodiments, packaged devices 100 and/or 200 may comprise a TCO such as TCO 500.

TCO 500 comprises an oscillator 510, a temperature sensor 520, and a temperature compensator 530. Oscillator 510 comprises a resonator 512 and a circuit 514. In some embodiments, resonator 512 is an acoustic resonator, such as a film bulk acoustic resonator (FBAR), or a solidly mounted resonator (SMR).

Oscillator 510 may comprise a Pierce oscillator, or a Colpitts oscillator, or another convenient configuration, for example the devices 400A or 400B of FIGS. 4A-B. The frequency of oscillation of oscillator 510 is dependent upon the temperature of the device due to changes in component parameters as a function of temperature. To reduce this change in frequency in oscillator 510 over a temperature range, a variety of techniques have been developed. For example, by configuring oscillator 510 as a Voltage Controlled Oscillator (VCO), the frequency can be modified electronically. In that case, temperature sensor 520 can measure the temperature of oscillator 510 and temperature compensator 530 can use the measured temperature to modify a parameter (e.g., a capacitance) of oscillator 510. In that case, temperature compensator 530 receives a temperature sensing signal from temperature sensor 520 and provides a control voltage signal to circuit 514 offset the oscillator frequency by an amount known to compensate for the change in the critical component parameters and oscillator frequency response over temperature.

Figure 6:
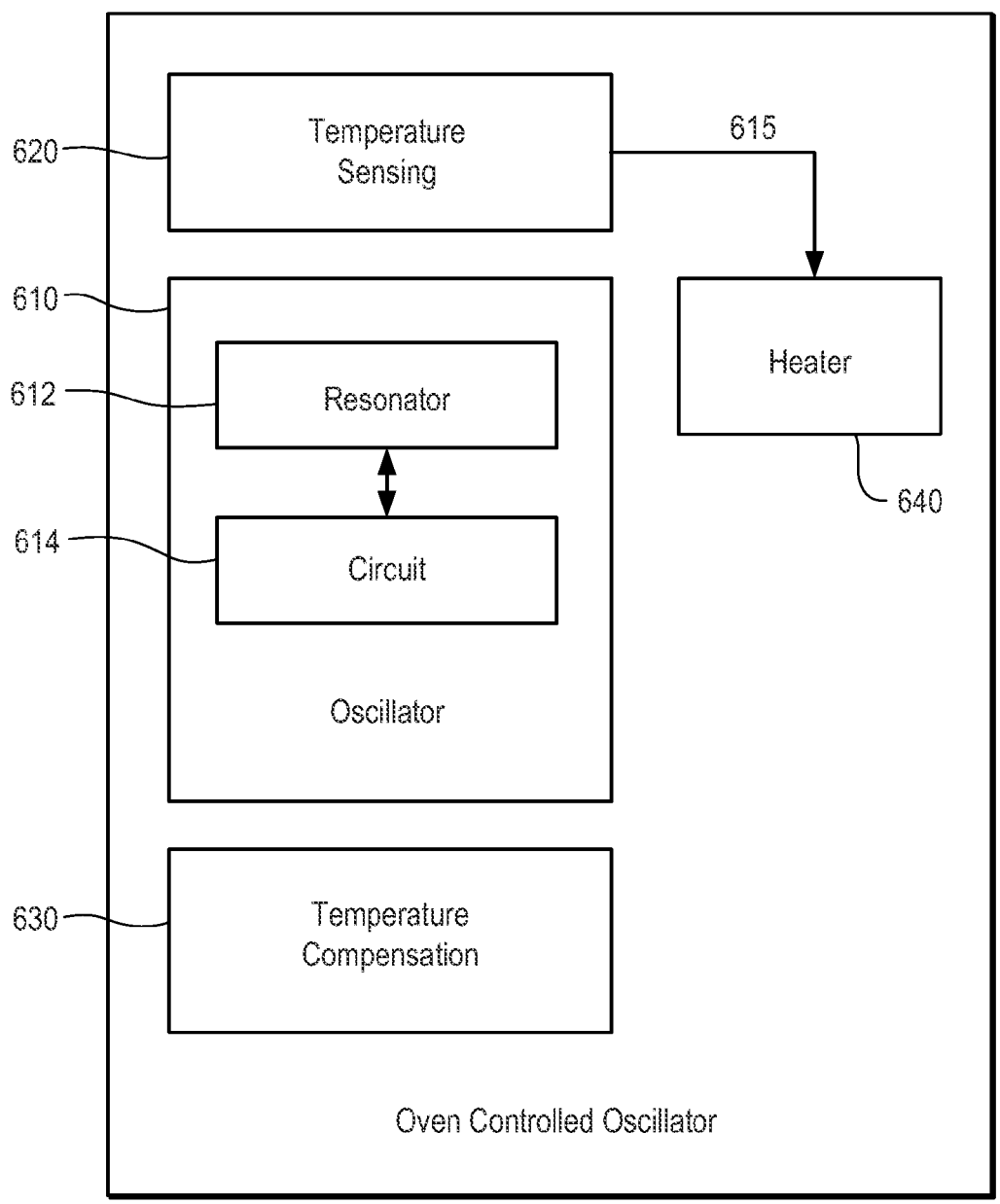
FIG. 6 shows a functional block diagram of one example embodiment of an oven controlled oscillator.

FIG. 6 shows a functional block diagram of one example embodiment of an oven controlled oscillator 600. In some embodiments, packaged devices 100 and/or 200 may comprise an oven controlled oscillator such as oven controlled oscillator 600. Oven controlled oscillator includes an oscillator 610, a temperature sensor 620, and a temperature compensator 630. Oscillator 610 comprises a resonator 612 and a circuit 614. Compared to TCO 500, oven controlled oscillator 600 includes a temperature controller or heater 640.

Temperature controller or heater 640 is capable of controlling the temperature of oscillator 610, and in particular operates in conjunction with temperature sensor 620 and a feedback signal 615 to maintain the temperature of oscillator 610 at a desired constant temperature and thereby avoid changes in output frequency of oscillator 610 due to temperature-variable characteristics of components of oscillator 610.

Typically, the temperature performance of resonator 612 dominates the frequency response over temperature of oscillator 610. Therefore, a physically tight coupling between oscillator 610, temperature sensor 620, and temperature controller or heater 640 is desired. Also, thermal conduction should be controlled. Low thermal conduction from resonator 612 to other elements of higher thermal mass allows temperature controller or heater 640 to more quickly heat resonator 612 since thermal mass is minimized.

Beneficially, the packaging arrangements described above with respect to packaged devices 100 and 200 may support these desired features.

Temperature sensor 620 may employ a variety of devices to measure the temperature of resonator 612 in oscillator 610. In one embodiment, temperature sensor 620 employs a diode to detect a change in temperature due to the change in its forward bias voltage as a function of temperature. Other devices and circuits may be employed.

Figure 7:
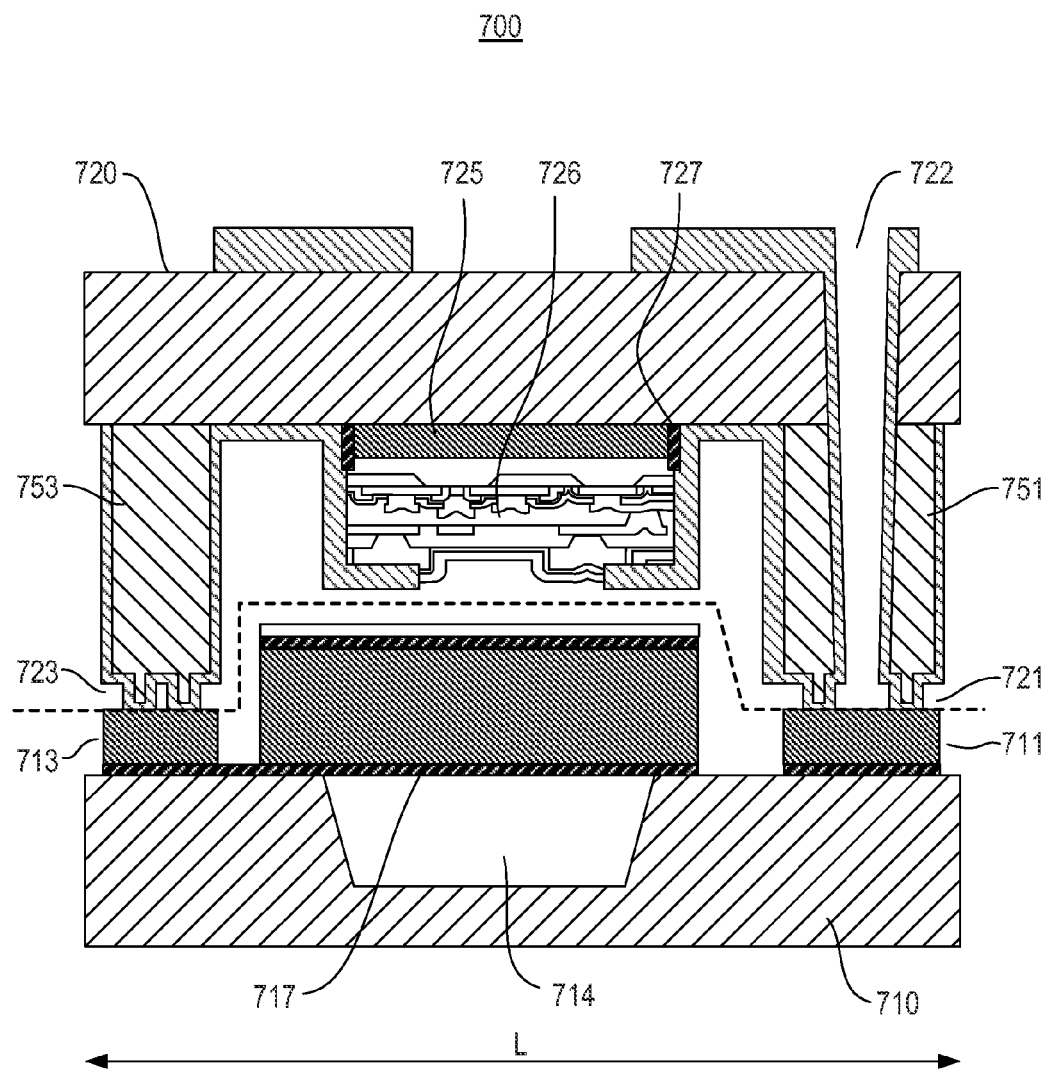
FIG. 7 shows yet another example embodiment of a packaged device.

FIG. 7 shows yet another example embodiment of a packaged device 700. Packaged device 700 comprises a base substrate 710 and a cap substrate 720.

Base substrate 710 has on a first surface (top surface as shown in FIG. 7) thereof: a first bonding pad 711; a second bonding pad 713; and a recessed region 714. Base substrate 710 further includes on the first surface thereof a peripheral pad not shown in FIG. 7, but examples of which are illustrated above in FIGS. 2 and 3A. Also, in some embodiments base substrate 710 may include additional first and second bonding pads 711 and 713.

Cap substrate 720 has on a first surface (bottom surface as shown in FIG. 7) thereof: bonding pad seal 721 provided on a standoff 751 and an electrically conductive (e.g., metal) layer(s) disposed thereon, having a corresponding through hole 722 formed in cap substrate 720; a drop down contact post 723 provided with a standoff 753 and an electrically conductive (e.g., metal) layer(s) disposed thereon; a low-resistivity material layer (e.g., epitaxial layer) region 725; and. electronic circuitry 726 formed on low-resistivity material layer (e.g., epitaxial layer) region 725. Cap substrate 720 further includes on the first surface thereof a peripheral pad seal not shown in FIG. 7, but examples of which are illustrated in FIGS. 2 and 3B. Also, in some embodiments cap substrate 720 may include additional bonding pad seals 721, including corresponding through holes 722, and/or additional drop down contact posts 723. In some embodiments, one or more of the through holes 722 in cap substrate 720 are plated or otherwise filled with an electrically conductive material (e.g., metal) to provide an electrical connection between the corresponding bonding pad seal 721 and a second surface (top surface as shown in FIG. 7) thereof.

Packaged device 700 further comprises an acoustic resonator 717 disposed on base substrate 710 above recessed region 714. In some embodiments, acoustic resonator 717 is electrically connected to electronic circuitry 726, for example by means of second bonding pad 713 and the conductive (e.g., metal) layer(s) of the drop down contact post 723. In some embodiments, acoustic resonator 717 comprises a film bulk acoustic resonator (FBAR). In other embodiments, a solidly mounted resonator (SMR) may be employed.

In some embodiments, base substrate 710 and/or cap substrate 720 comprise a semiconductor substrate. In some embodiments, cap substrate 720 can be made of an electronically non-conductive material or a high-resistivity semiconductor material, such as single crystal silicon. In alternative embodiments, cap substrate 120 may comprise other high-resistivity materials, for example a silicon-on-insulator (SOI) substrate, and low-resistivity material layer region 725 may be formed by controlled doping of the SOI substrate.

In some embodiments, base substrate 710 and cap substrate 720 are made of materials that have the same or approximately the same coefficient of thermal expansion (CTE) as each other, to avoid thermal expansion mismatch problems. In some embodiments base substrate 710 and cap substrate 720 are made of the same semiconductor material as each other.

Provided on the first surface of cap substrate 720 are standoffs 751 and 753 which may be formed of a material different than the semiconductor material of cap substrate 720. In some embodiments, standoffs 751 and 753 are formed of an electrically insulating material which may be covered with one or more electrically conductive (e.g., metal) layers. In other embodiments, standoffs 751 and 753 are formed of a solid electrically conductive material, for example copper or gold. By employing standoffs 751 and 753, a distance between the first surface of cap substrate 720 and base substrate 710 can be increased. Accordingly, in packaged device 700, electronic circuitry 726 is disposed directly opposite and confronting acoustic resonator 717. Thus packaged device 700 may have a reduced length or lateral dimension ("L" dimension in FIGS. 1, 2 and 7) compared to packaged devices 100 and 200, all other factors being equal.

In some embodiments one or more portions of low-resistivity material layer (e.g., epitaxial layer) material is removed between bonding pad seals 721, drop down contact posts 723, and the peripheral pad seal so as to eliminate a current path through the epitaxial material between any two of the bonding pad seals 721, drop down contact posts 723, and the peripheral pad seal. Furthermore, in some embodiments one or more portions of low-resistivity material layer (e.g., epitaxial layer) material is removed so as to eliminate a current path between low-resistivity material layer (e.g., epitaxial layer) region 725 and the conductive layer(s) of some or all of the bonding pad seals 721, and/or drop down contact posts 723, and/or the peripheral pad seal.

In a particular embodiment of packaged device 700 shown in FIG. 7, the low-resistivity material layer (e.g., epitaxial layer is eliminated except for: (1) low-resistivity material layer (e.g., epitaxial layer) region 725, which is isolated from some or all of the bonding pad seals 721, and/or drop down contact posts 723, and/or the peripheral pad seal; and; and (2) one or more low-resistivity material layer (e.g., epitaxial layer) portions remaining in the treads of one or more of the bonding pad seal(s) 721, drop down contact post(s) 723 and the peripheral pad seal. Furthermore, cap substrate 720 of packaged device 700 includes an electrically insulating layer 727 electrically isolating low-resistivity material layer (e.g., epitaxial layer) region 725 from one or more electrically conductive (e.g., metal) layers or traces in contact with bonding pad seal(s) 721 and drop down contact post(s) 723. In some embodiments, electrically insulating layer 727 partially or totally encompasses or surrounds low-resistivity material layer (e.g., epitaxial layer) region 725.

In a variation of packaged device 700, particularly where standoff 751 is formed of a solid electrically conductive material, for example copper or gold, through hole 722 may not extend through standoff 751 down to first bonding pad 711, in which case standoff 751 may be considered to be a pad on the bottom surface of cap substrate 720.

Figure 8:
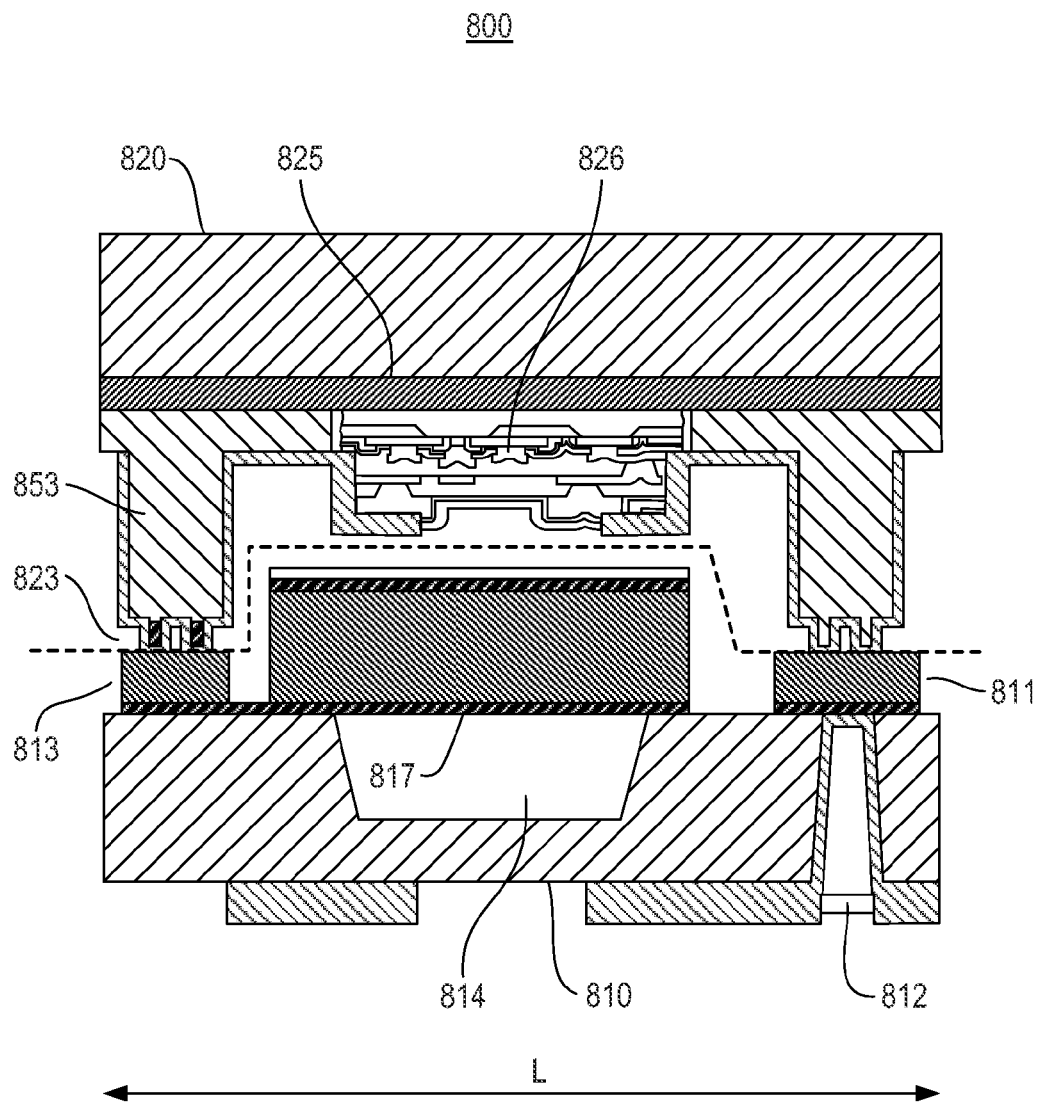
FIG. 8 shows still another example embodiment of a packaged device.

FIG. 8 shows still another example embodiment of a packaged device 800. Packaged device 800 comprises a base substrate 810 and a cap substrate 820.

Base substrate 810 has on a first surface (top surface as shown in FIG. 8) thereof: a first bonding pad 811, having a corresponding through hole 812 formed in base substrate 810; a second bonding pad 813; and a recessed region 814. Base substrate 810 further includes on the first surface thereof a peripheral pad not shown in FIG. 8, but examples of which are illustrated above in FIGS. 2 and 3A. Also, in some embodiments base substrate 810 may include additional first bonding pads 811, including corresponding through holes 812, and second bonding pads 813.

Cap substrate 820 has on a first surface (bottom surface as shown in FIG. 8) thereof: drop down contact post 823 provided with a standoff 853 and one or more conductive (e.g., metal) layer(s) disposed thereon; a low-resistivity material layer (e.g., epitaxial layer) region 825; and electronic circuitry 826 formed on low-resistivity material layer (e.g., epitaxial layer) region 825. Cap substrate 820 farther includes on the first surface thereof a peripheral pad seal not shown in FIG. 8, but examples of which are illustrated. in FIGS. 2 and 3B. Also, in some embodiments cap substrate 820 may include additional drop down contact posts 823.

In some embodiments, one or more of the through holes 812 in base substrate are plated or otherwise filled with a conductive material (e.g., metal) to provide an electrical connection between the corresponding bonding pad 811 and a second surface (bottom surface as shown in FIG. 8) thereof.

Packaged device 800 further comprises an acoustic resonator 817 disposed on base substrate 810 above recessed region 814. In some embodiments, acoustic resonator 817 is electrically connected to electronic circuitry 826 by means of drop down contact post(s) 823. In some embodiments, acoustic resonator 817 comprises a film bulk acoustic resonator (FBAR). In other embodiments, a solidly mounted resonator (SMR) may be employed.

In some embodiments, base substrate 810 and/or cap substrate 820 comprises a semiconductor substrate. In some embodiments, cap substrate 820 can be made of an electronically non-conductive material or a high-resistivity semiconductor material, such as single crystal silicon. In some embodiments, base substrate 810 and cap substrate 820 are made of materials that have the same or approximately the same coefficient of thermal expansion (CTE) to avoid thermal expansion mismatch problems. In some embodiments base substrate 810 and cap substrate 820 are made of the same semiconductor material as each other.

In a beneficial feature, in packaged device 800 low-resistivity material layer (e.g., epitaxial layer) region 825 on cap substrate 820 is electrically isolated from the conductive (e.g., metal) layer(s) of some or all of the drop down contact posts 823, and/or the peripheral pad seal.

Provided on the first surface of cap substrate 820 are standoff(s) 853 formed of a material different than the semiconductor material of cap substrate 820. In some embodiments, standoff(s) 853 are formed of an electrically insulating material. By employing standoff(s) 853, a distance between the first surface of cap substrate 820 and base substrate 810 can be increased. Accordingly, in packaged device 800, electronic circuitry 826 is disposed directly opposite and confronting acoustic resonator 817. Thus packaged device 800 may have a reduced length or lateral dimension ("L" dimension in FIGS. 1, 2 and 8) compared to packaged devices 100 and 200, all other factors being equal.

In packaged device 800, since through holes 812 are provided in base substrate 810 instead of in the cap substrate as in packaged devices 100, 200 and 700, the epitaxial layer on the first surface of cap substrate 820 can be left intact, and electrical isolation can be provided by standoff(s) 853.

Figure 9:
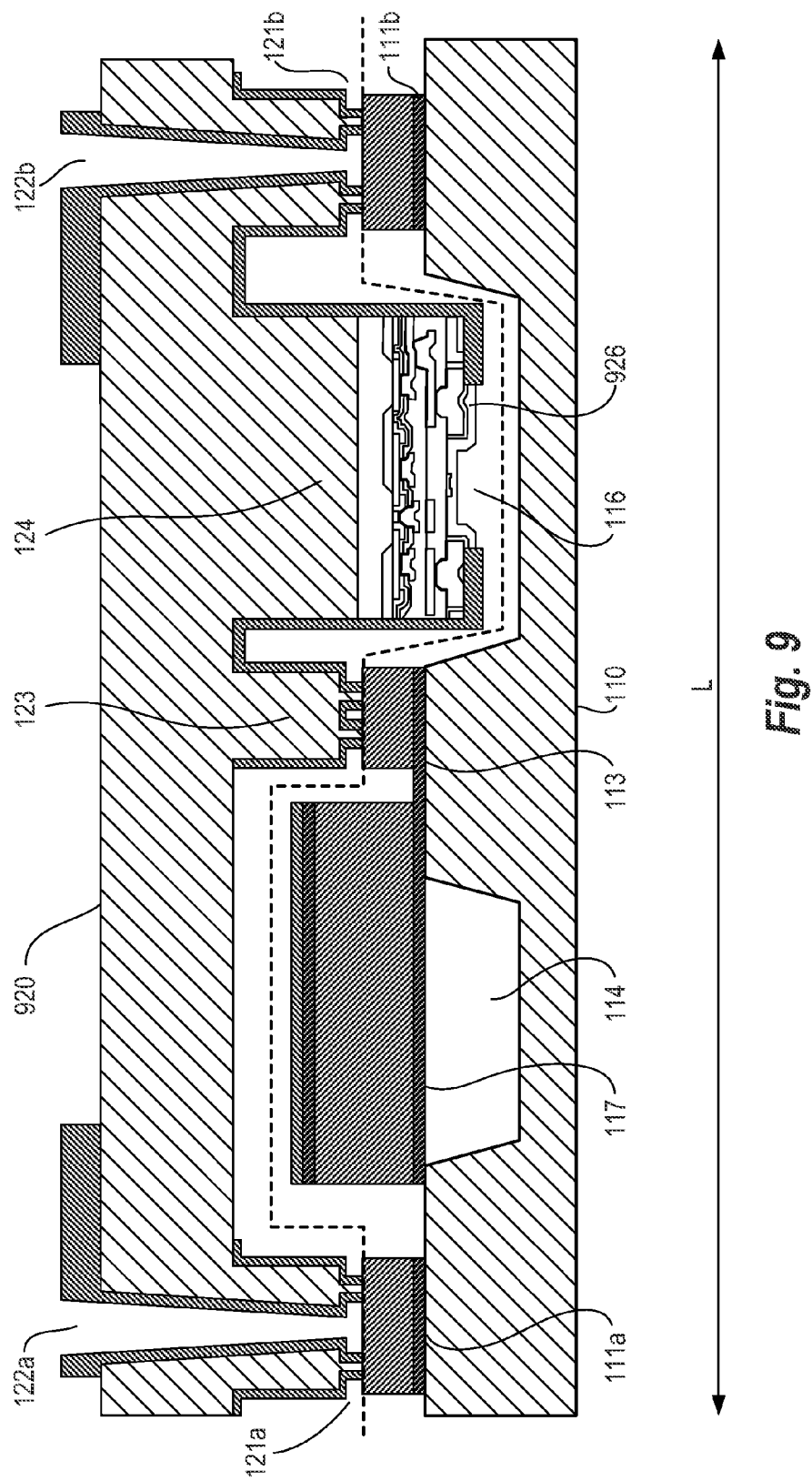
FIG. 9 shows a still further example embodiment of a packaged device.

FIG. 9 shows a still further example embodiment of a packaged device 900. Packaged device 900 is the same as packaged device 100 illustrated in FIG. 1, except that in packaged device 900, electronic circuitry 926 comprises CMOS devices, and cap substrate 920 does not have any low-resistivity material layer such as an epitaxial layer. It should be noted that embodiments similar to those shown in FIGS. 7 and 8 could also be produced with CMOS devices and no low-resistivity material layer or epitaxial layer as with the packaged device 900 shown in FIG. 9.

While example embodiments are disclosed herein, one of ordinary skill in the art appreciates that many variations that are in accordance with the present teachings are possible. For example, specific embodiments of packaging arrangements and methods of manufacture have been described above in the context of oscillators employing acoustic resonators where these packaging arrangements and methods of manufacture have particular benefits. However it should be understood, for example, that the packaging arrangements and methods described above have applicability and benefits for a wide variety of devices which include electronic circuitry fabricated on a cap substrate and packaged in a hermetically sealed environment, with or without an acoustic resonator provided on the base substrate. The invention therefore is not to be restricted except within the scope of the claims.

The invention claimed is:

1. A packaged device, comprising:
   a base substrate having a first bonding pad and a peripheral pad provided thereon, the peripheral pad encompassing the first bonding pad;
   an acoustic resonator disposed on the base substrate;
   a cap substrate having a bonding pad seal and a peripheral pad seal provided thereon, the bonding pad seal bonding around the perimeter of the first bonding pad and the peripheral pad seal bonding with the peripheral pad to define a hermetically sealed volume between the cap substrate and the base substrate, the cap substrate defining a through hole therein positioned over the first bonding pad, the through hole providing access for an electrical connection to the first bonding pad;
   a material layer region provided on a portion of a first surface of the cap substrate within the hermetically sealed volume, wherein the material layer region comprises a material having a substantially lower resistivity than the cap substrate and is electrically isolated from the bonding pad seal; and
   electronic circuitry formed on the material layer region and electrically connected with the acoustic resonator.

2. The device of claim 1, wherein the base substrate has a second bonding pad, and the cap substrate has a drop down contact post bonded to the second bonding pad and providing an electrical connection between the acoustic resonator and the electronic circuitry, wherein the material layer region is electrically isolated from the drop down contact post.

3. The device of claim 2, further comprising an electrically insulating material isolating the material layer region from at least one of: (1) an electrically conductive trace in contact with the bonding pad seal, and (2) an electrically conductive trace in contact with the drop down contact pad.

4. The device of claim 1, wherein the acoustic resonator is laterally offset with respect to the electronic circuitry.

5. The device of claim 1, wherein the cap substrate includes a second surface opposite the first surface, wherein the first surface of the cap substrate includes a pedestal and a recessed region, wherein the pedestal is located at a greater distance from a second surface of the cap substrate than the recessed region, wherein the electronic circuitry is disposed on the pedestal, and the recessed region is disposed above the acoustic resonator.

6. The device of claim 1, wherein the base substrate includes a first surface disposed opposite the first surface of the cap substrate, the first surface of the base substrate including a first recessed region disposed opposite the electronic circuitry, and including a second recessed region disposed beneath the acoustic resonator.

7. The device of claim 1, wherein the bonding pad seal comprises a standoff formed of a material different than the semiconductor material of the cap substrate.

8. The device of claim 1, wherein the electronic circuitry is disposed directly opposite and confronting the acoustic resonator.

9. The device of claim 1, wherein the electronic circuitry and the acoustic resonator comprise an oscillator.

10. The device of claim 9, wherein the oscillator is a temperature compensated oscillator, and wherein the electronic circuitry formed on the cap substrate comprises a temperature measuring element and a feedback circuit adapted to adjust a component in the electronic circuitry in response to the temperature measuring element to maintain an output frequency of the oscillator at a desired value as the temperature changes.

11. The device of claim 9, wherein the oscillator is an oven controlled oscillator, and wherein the electronic circuitry formed on the cap substrate comprises a temperature measuring element, a heating element, and a feedback circuit adapted to control the heating element to maintain a substantially constant temperature.

12. The device of claim 1, wherein the base substrate comprises at least one additional bonding pad, and wherein the cap substrate comprises at least one additional bonding pad seal bonded to the additional bonding pad, wherein there is no material having the lower resistivity connecting the two bonding pad seals.

13. The device of claim 1, wherein both the base substrate and the cap substrate are configured to be parametrically tested prior to bonding the base substrate to the cap substrate.

14. The device of claim 1, wherein the cap substrate is a cap semiconductor substrate, and the material layer region is an epitaxial layer region formed on the cap semiconductor substrate.

15. A method of making a packaged device, the method comprising:
   providing a base substrate including: a first bonding pad, a peripheral pad encompassing the first bonding pad, and an acoustic resonator;
   providing a cap substrate including: a bonding pad seal having a through hole therein, a peripheral pad seal encompassing the bonding pad seal, a material layer region disposed on a portion of a first surface of the cap substrate, and electronic circuitry formed on the material layer region, wherein the material layer region comprises a material having a substantially lower resistivity than the cap substrate and is electrically isolated from the bonding pad seal; and
   bonding the base substrate to the cap substrate to define a hermetically sealed volume between the cap substrate and the base substrate and to electrically connect the electronic circuitry and the acoustic resonator.

16. The method of claim 15, wherein bonding the base substrate to the cap substrate comprises bonding the bonding pad seal around the perimeter of the first bonding pad, and bonding the peripheral pad seal with the peripheral pad.

17. The method of claim 15, wherein providing the cap substrate includes:
   providing a semiconductor substrate having an epitaxial layer thereon;
   forming the electronic circuitry on the epitaxial layer; and
   removing one or more portions of the epitaxial layer so as to eliminate a current path through the epitaxial layer between electronic circuitry and the bonding pad seal.

18. The method of claim 17, wherein the step of removing the one or more portions of the epitaxial layer is performed before the step of forming the electronic circuitry on the epitaxial layer.

19. The method of claim 15, further comprising parametrically testing the base substrate and the cap substrate prior to bonding the base substrate to the cap substrate.

20. The method of claim 15, wherein providing the cap substrate includes providing a semiconductor substrate having an epitaxial layer thereon, the method further comprising:
   providing at least one additional bonding pad on the base substrate;
   providing at least one additional bonding pad seal on the cap substrate;
   bonding the additional bonding pad seal to the additional bonding pad; and
   removing one or more portions of the epitaxial layer so as to eliminate a current path through the epitaxial layer between the two bonding pad seals.

21. A packaged device, comprising:
   a base substrate having a bonding pad and a peripheral pad provided on a first side thereof, the peripheral pad encompassing the bonding pad, wherein the base substrate has a through hole therein positioned beneath the bonding pad, the through hole providing access for an electrical connection to the bonding pad;
   an acoustic resonator disposed on the base substrate;
   a cap substrate having a drop down contact post and a peripheral pad seal provided thereon, the drop down contact post having an electrically conductive layer on a portion thereof and bonding with the bonding pad, and the peripheral pad seal bonding with the peripheral pad to define a hermetically sealed volume between the cap substrate and the base substrate;
   a material layer disposed on at least a portion of a first surface of the cap substrate disposed in the hermetically sealed volume, wherein the material layer comprises a material having a substantially lower resistivity than the cap substrate; and
   electronic circuitry formed on the material layer and electrically connected with the acoustic resonator,
   wherein the dropdown contact post includes an electrically insulating material, and
   wherein the metal layer on the dropdown contact post is electrically isolated from the material layer.

* * * * *